United States Patent [19]

Slodzian et al.

[11] Patent Number: 4,694,170

[45] Date of Patent: Sep. 15, 1987

[54] INSTRUMENT FOR VERY HIGH RESOLUTION IONIC MICRO-ANALYSIS OF A SOLID SAMPLE

[75] Inventors: Georges Slodzian, Sceaux; Bernard Daigne, Chatenay Malabry; Francois Girard, Paris, all of France

[73] Assignees: Office National d'Etudes et de Recherches Aerospatiales; Universite de Parissud, both of Paris, France

[21] Appl. No.: 813,145

[22] Filed: Dec. 24, 1985

[30] Foreign Application Priority Data

Dec. 28, 1984 [FR] France .................... 84 20053

[51] Int. Cl.[4] ............................................ H01J 37/256
[52] U.S. Cl. ................................. 250/309; 250/310; 250/398; 250/399
[58] Field of Search .............. 250/306, 309, 310, 311, 250/396 R, 397, 398, 399

[56] References Cited

U.S. PATENT DOCUMENTS

| | | | |
|---|---|---|---|
| 3,517,191 | 6/1970 | Liebl | 250/309 |
| 3,585,383 | 6/1971 | Caistaing et al. | 250/309 |
| 3,617,739 | 11/1971 | Liebl | 250/49.5 P |
| 3,845,305 | 10/1974 | Liebl | 250/309 |
| 4,564,758 | 1/1986 | Slodzian et al. | 250/309 |

FOREIGN PATENT DOCUMENTS

| | | | |
|---|---|---|---|
| 0150941 | 8/1985 | European Pat. Off. | 250/398 |
| 3144604 | 5/1983 | Fed. Rep. of Germany . | |
| 2532111 | 8/1983 | France . | |

OTHER PUBLICATIONS

Nuclear Instruments & Methods in Physics Research, vol. 187, No. 1, Aug. 1981, pp. 143-151, North-Holland Publishing Company, Amsterdam, NL; H. Liebl: "Beam Optics in Secondary Ion Mass Spectrometry".

Primary Examiner—Carolyn E. Fields
Assistant Examiner—Paul A. Guss
Attorney, Agent, or Firm—Staas & Halsey

[57] ABSTRACT

A sample (EC) is mounted on a sample carrier (PO). Vertically thereabove a common optical portion (5) receives a beam of primary ions derived from an ion source (S10) together with a beam of primary electrons derived from an electron source (S30). The secondary electrons and ions due to the sample (EC) being bombarded by said primary ions and electrons are retrieved by said common optical portion (5). The electrons are detected by electron detection means (D40). The secondary optical system (2) transmits the secondary ions to a mass spectrometer (SP20). This instrument is capable of providing ion and electron images of a single sample simultaneously.

19 Claims, 21 Drawing Figures

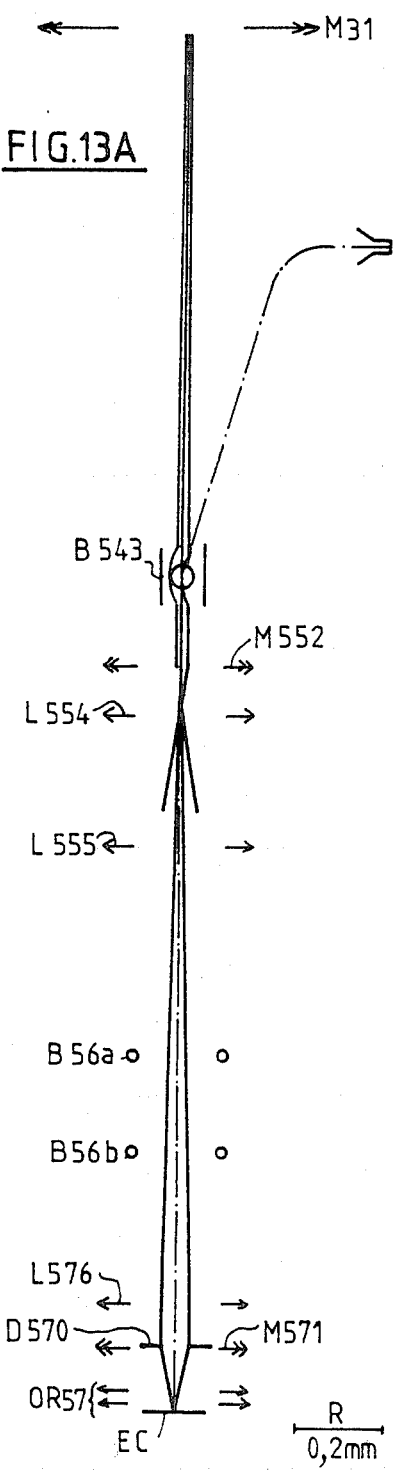
FIG.13A (30 keV)
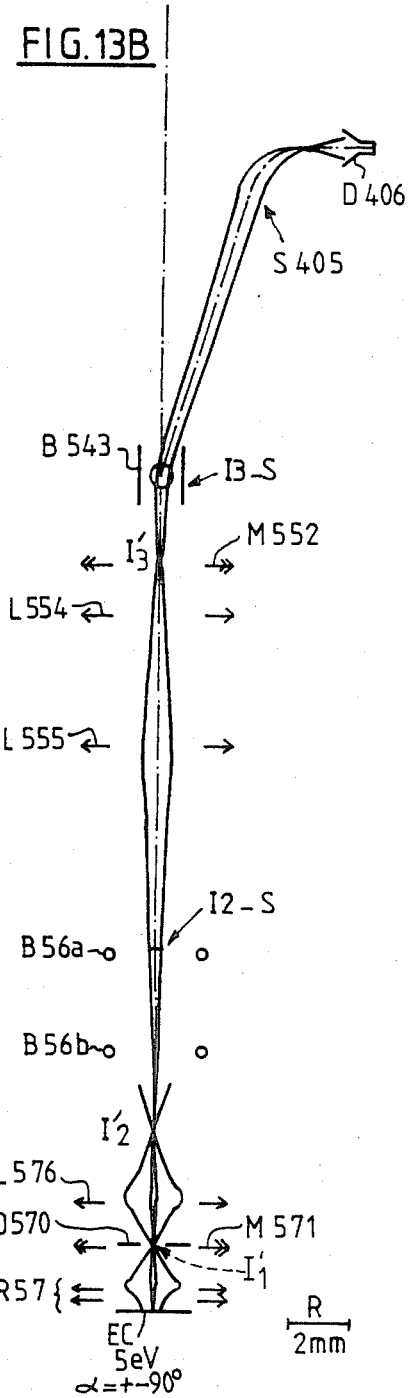
FIG.13B (5 keV)

INSTRUMENT FOR VERY HIGH RESOLUTION IONIC MICRO-ANALYSIS OF A SOLID SAMPLE

The invention relates to analyzing elements and isotopes from very small volumes of material taken from the surface of a solid sample.

BACKGROUND OF THE INVENTION

Such measurements have previously been performed using an instrument such as the IMS-3F ion microscope sold by the French CAMECA corporation. The following patents relate to said instrument: French patent No. 1,240,658 filed July 30th, 1959; U.S. Pat. No. 3,585,383, British patent No. 1,183,310 and French patent application Ser. No. 2,542,089 filed Jan. 14th, 1983 corresponding to U.S. patent application Ser. No. 575,828 filed Jan. 2, 1984.

Operation of an ion microscope may be summed up as follows: a target is bombarded with a beam of primary ions which are all of the same nature, and at a controlled energy, said ions covering the entire observed surface. Under the effect of this bombardment, each point of the target releases the atoms located at said point. A considerable portion of these atoms may be spontaneously ionized during the ejection process and thus constitute positive or negative secondary ions which are characteristic of the chemical and isotopic composition of the eroded volume. The beam of secondary ions created in this way is taken and used to create an ion image of the sample, and for sequential analysis by means of a mass spectrometer.

This prior instrument has enabled considerable progress to be made by virtue of its qualities of detection sensitivity and of mass resolution, and also by its ability to form an "ion image" for each element present in the solid sample being analyzed.

There now arises a need to further improve resolution, and in particular to improve spatial resolution, and also to improve detection sensitivity while enabling several elements to be detected simultaneously so that very small volumes of material can be analyzed using a method which is inherently destructive. It is also essential to dispose of independent and non-destructive means for initial observation of the sample.

Preferred implementations of the present invention solve the above problem.

One of the aims of the invention is to focus a narrow and intense probe of primary ions (1 $\mu$m at 200 Å) in a manner which is compatible with highly efficient collection of the secondary ions which are emitted over a very large solid angle and which are dispersed over an energy band of several tens of electron-volts.

Another aim of the invention is to allow simultaneous observation of the sample by means of a scanning electron microscope using the secondary electrons or else using transmitted electrons, or else using backscattered electrons.

A third aim of the invention is to provide apparatus which scans the primary electrons and ions together in such a manner as to simultaneously produce the electron image of the scanning microscope and the ion images each of which gives the distribution of one of the elements present at the surface of the sample.

Such scanning must be compatible with simultaneous analysis (in parallel) of the various secondary ions released by each of the scanned points of the target, while retaining high sensitivity and high mass resolution.

(high resolution and simultaneous multiple detection mass spectometer).

The scanner must also be compatible with the beam of primary ions being focussed into a narrow probe regardless of its position on the surface.

Furthermore, the scanning must retain the necessary qualities in the secondary beams of ions and of electrons.

Another aim of the invention is to allow four beams having different energies to pass simultaneously along the same optical axis in a manner which is compatible with independent adjustments being performed on each of said beams.

Yet another aim of the invention is to provide an instrument which is compact. This is important for reasons of mechanical stability and because of the high vacuum which is required for proper operation of the instrument.

SUMMARY OF THE INVENTION

The invention provides an instrument which is comparable with the above-mentioned CAMECA instrument in that it comprises, within an evacuated enclosure:

a moving sample carrier suitable for receiving the sample to be analyzed;

a source of primary ions;

first electrostatic optical means for causing a beam of primary ions from said source to bombard said sample; and second electrostatic optical means for collecting the secondary ions emitted by the sample in response to the bombarding primary ions, and for conveying the beam of secondary ions collected in this manner to the inlets of an ion analyzer including a mass spectrometer.

According to a first aspect of the invention, an instrument in accordance with the invention has the following features:

Said first and second electrostatic optical means comprise a common and coaxial optical portion having an axis which is perpendicular to the sample carrier and which extends to the vicinity thereof in order to provide highly efficient collection of secondary ions while using the same optical components to simultaneously process the beam of primary ions and the beam of secondary ions;

Said first and second optical means include, at the end of said common optical portion furthest from said sample carrier, means in the form of a transverse electrostatic field for separating primary ions from secondary ions and means suitable for causing said beam of primary ions to scan, and for dynamically and synchronously correcting in said beam of secondary ions the effects which result from displacing the emissive zone on the sample surface, the pivot center of the primary scanning lying on the axis of the common optical portion; and Autonomous electron observation means are provided comprising magnetic optical members incorporated coaxially with said common optical portion but adjustable in a manner which is substantially decoupled from said first and second electrostatic optical means, together with means for applying a transverse magnetic field perpendicular to the above-mentioned electrostatic field in order first to cancel the deflection which said electrostatic field would otherwise produce on the primary electron beam, and second to separate the electron beam and the beam of secondary ions, thereby enabling an ion image of the sample and an electron image of the sample to be obtained simultaneously.

Preferably, the autonomous observation means is disposed as a scanning electron microscope having its electron scanning beams incorporated in said common optical portion.

According to another aspect of the invention, the common optical portion includes an electrostatic lens for bringing the pivot center of the primary scanning to the center of a diaphragm which delimits the angular aperture of the primary beam, together with a near optical system suitable for co-operating with the sample:

firstly to focus a reduced image of the ion source (the ion probe) on the surface of the sample, which focussing may be modulated in synchronism with the scan in order to correct focussing as a function of the position of the probe on the surface (dynamic focussing correction); and secondly to collect both secondary ions and electrons widely and efficiently in order to form electron and ion images in the vicinity of said diaphragm.

In an advantageous embodiment, said near optical system comprises, going from the diagraphm towards the sample:

a grounded annular electrode;

a collection-controlling electrode connected to a singal of the same polarity as the sample;

a focussing electrode connected to a signal of the opposite polarity as the sample and an annular electrode placed in the vicinity of the sample to delimit the sample surface liable to disturb the focussing electric fields, said electrode being connected to a signal of the same polarity as the sample, which polarity is opposite to the polarity of the incident primary ions.

Typically for positive primary ions and negative secondary ions, the energy of the primary ion beam is 10 keV upstream from the near optical system and rises to 15 keV by said near optical system co-operating with the sample which is taken to a potential of −5 keV, and the energy of the secondary ions is equal to 5 keV at the diaphragm.

The instrument advantageously further includes a magnetic lens in the vicinity of the diaphrgm of the near optical system.

More generally, the near optical system constitutes a portion of an optical system for forming the ion probe and for collecting the secondary ions, said optical system further including an electrostatic lens upstream from the diaphragm.

Overall, the common coaxial portion comprises, upstream from said optical system for forming the probe and for collecting the secondary ions:

a beam combiner/separator comprising a pair of electrostatic plates and defining the pivot center;

an optical system for shaping the ion and the electron beams; and electron beam scanning means.

In its scanning electron microscope application, the shaping optical system comprises a magnetic lens followed by two electrostatic lenses which are polarized by opposite voltages, and the scanning means comprise two electromagnetic windings disposed one behind the other.

The ion scanning means on the primary beam and the synchronous correction means on the secondary beam preferably comprise two pairs of plates disposed after two electrostatic sectors on the primary ion side and two pairs of plates preceding two electrostatic sectors on the secondary ion side.

Advantageously, the instrument then includes firstly an electrostatic lens for providing coupling between the two primary electrostatic sectors, and secondly an energy filtering slot followed by an electrostatic lens for providing coupling between the two secondary electrostatic sectors, the assembly being arranged to produce ion deflections which are substantially achromatic to the first order.

Similarly, the first optical means include, after the source of ions, an optical system for adjusting the diameter of the ion probe.

Thus, the first optical means form successively smaller images of the source of ions, while both the ion and the electron secondary images formed in the vicinity of the diaphragm are at substantially unity enlargement.

At the other end of the instrument, the ion analyzer advantageously includes a transfer optical system followed by a high-aperture mass spectrometer capable of simultaneous multiple detection.

Like the source of primary ions, the instrument may include, coaxially with said common optical portion and upstream therefrom, an electron gun, followed by a magnetic lens for adjusting the diameter of the electron probe.

Typically, the energy of the primary electrons is about 30 keV.

In a variant of the invention, with an insulating sample, the energy of the primary electrons is reduced so that they can be reflected from the vicinity of the surface with substantially zero energy. This arrangement eliminates charge effects due to the ion bombardment (and is described in the above-mentioned French patent application Ser. No. 8,300,538).

In another variant, the energy of the primary electrons is about 100 keV, and the sample is thin and is observed by transmission.

Finally, the instrument preferably includes, starting from the further end of the common portion from the sample, another electrostatic sector which retrieves the secondary electrons and conveys them towards a detector.

BRIEF DESCRIPTION OF THE DRAWINGS

An embodiment of the invention is described by way of example with reference to the accompanying drawings, in which:

FIGS. 13A and 13B respectively show the trajectories of primary electrons and secondary electrons in a detailed optical diagram of the axial portion of the instrument.

DETAILED DESCRIPTION

Figure 1:
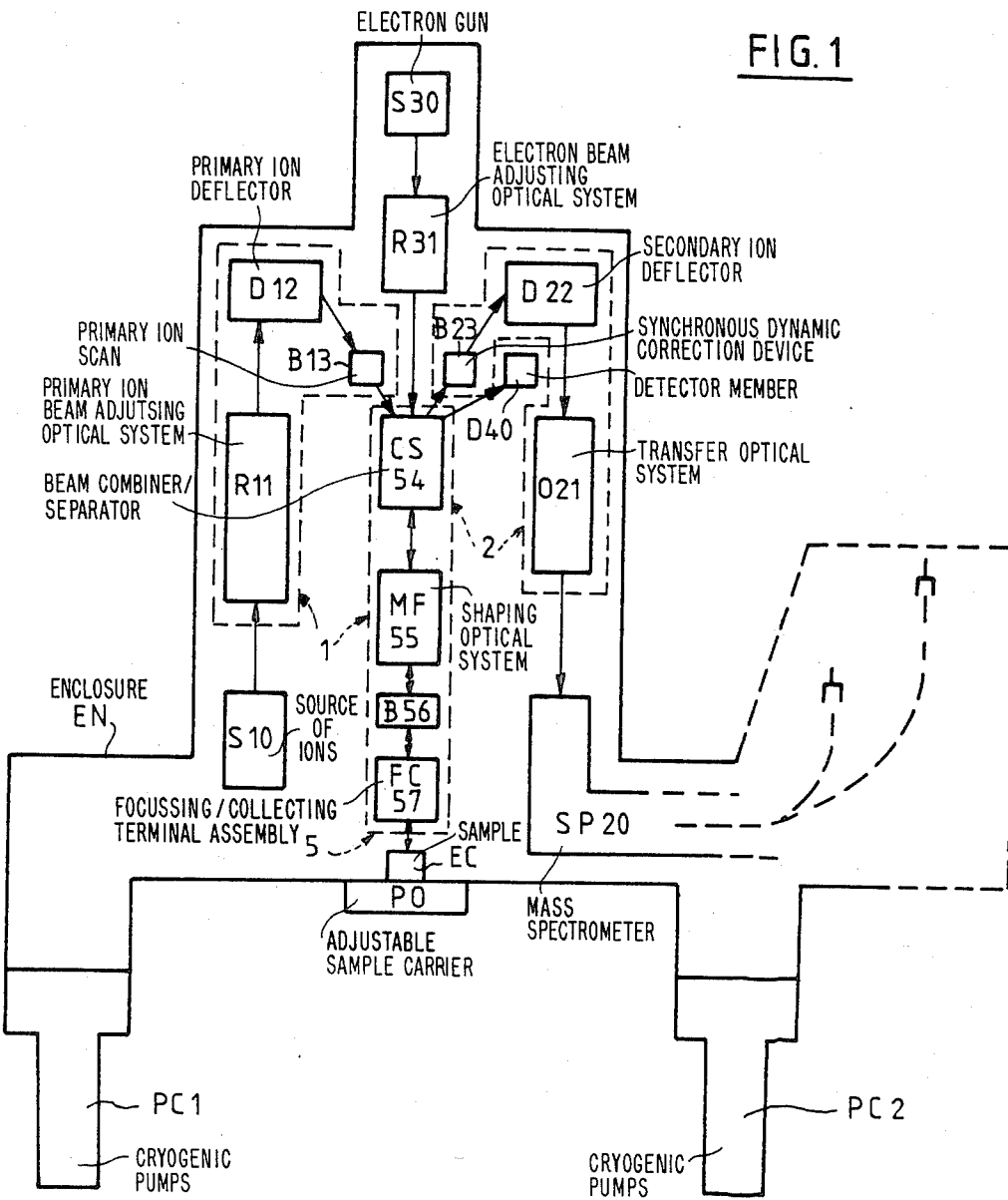
FIG. 1 is a block diagram of an instrument in accordance with the invention.
Figure 2:
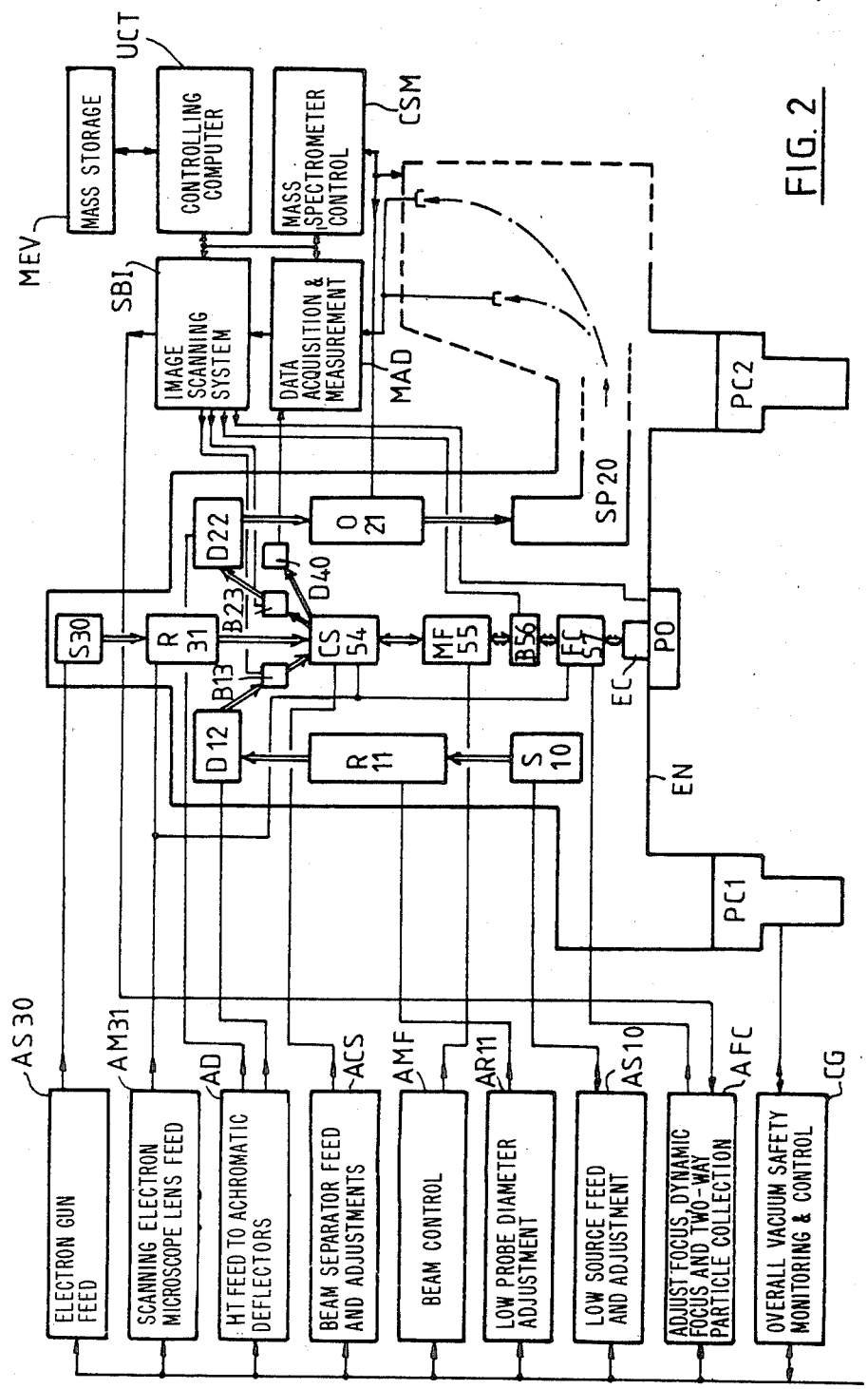
FIG. 2 is a second block diagram of the same instrument showing auxiliary electronic equipment used in conjunction therewith.
Figure 3:
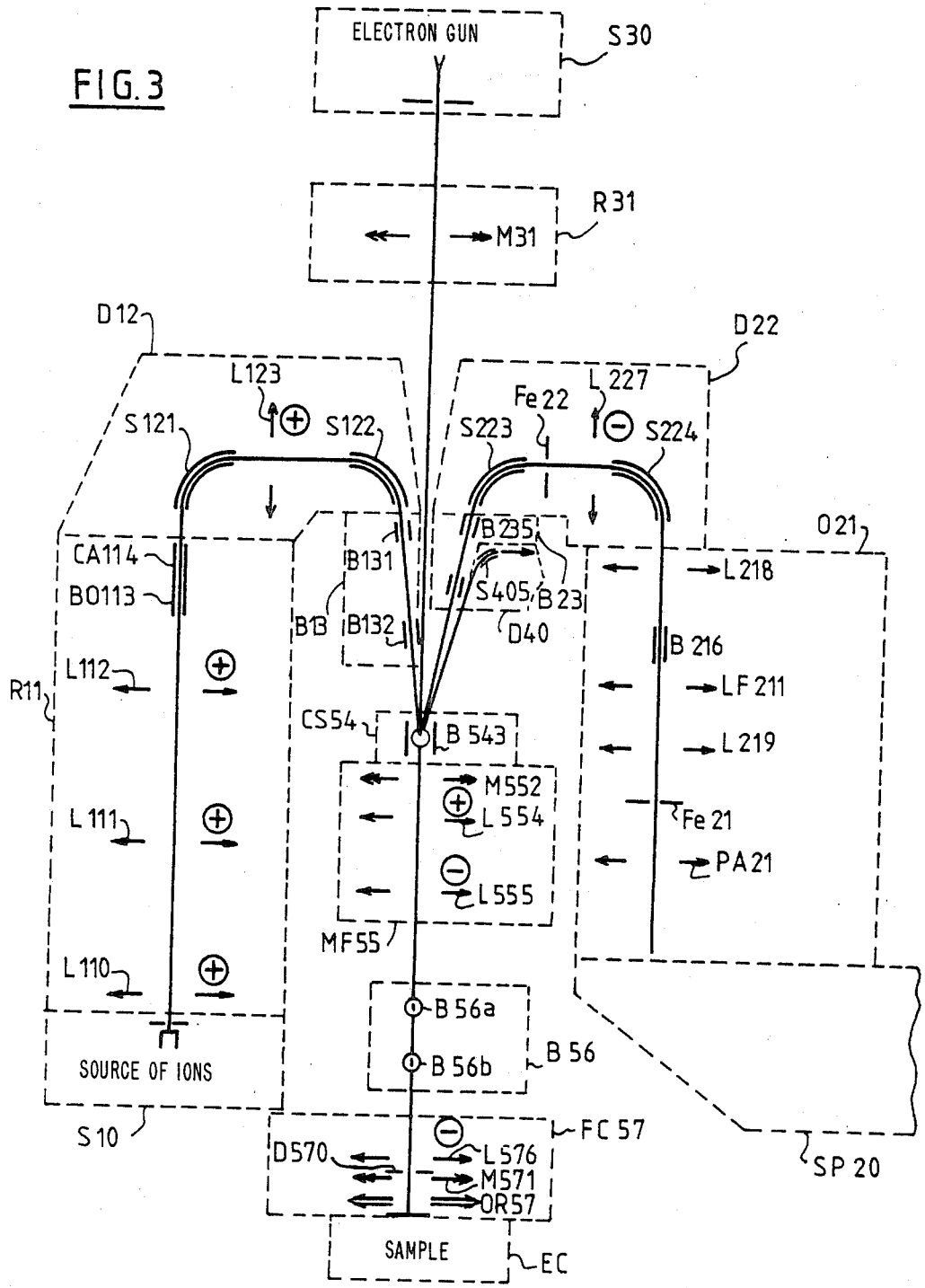
FIG. 3 is a detailed optical diagram of an instrument in accordance with the invention.

FIGS. 1 to 3 show that the instrument described includes a source of ions S10 and a mass spectrometer SP20 which is preceded by a transfer optical system O21.

In a preferred embodiment of the invention, the source of ions is the source described in U.S. Pat. Ser. No. 730,172 filed on May 3, 1985 and entitled "A source of ions operating by surface ionization, in particular for providing an ion probe". Similarly, the mass spectrometer and its transfer optical system are as described in U.S. Pat. Ser. No. 695,240 filed on Jan. 28, 1985 under the title "A high-aperture mass spectrometer capable of multiple simultaneous detection". The contents of each of these two prior patent applications is incorporated in the present description in order to add to the description and to the definition of the invention.

Further, the present invention makes use both of a beam of ions and of a beam of electrons. By an extension of meaning which is now conventional, the words "optical" and "optics" are used to cover devices which operate on such beams in the same way as corresponding devices operate on beams of photons. Ion optics makes use of electrostatic means, for the most part; the primary electron optics makes use of magnetic fields (from magnetic or electromagnetic means), for the most part; and the lower energy secondary electrons are subject to the effects both of the magnetic fields and of the electrostatic means.

OVERALL DESCRIPTION

The instrument in accordance with the invention shown in FIGS. 1 to 3 lies inside an enclosure EN in which a high vacuum is maintained by cryogenic pumps PC1 and PC2.

An adjustable sample carrier PO supports a sample EC and is capable of displacing the sample parallel to its free surface.

In the center, perpendicularly to the surface of the sample, the instrument is disposed like the column of a scanning electron microscope.

In accordance with an important feature of the invention, this column has a common and coaxial optical portion for the beams of primary and secondary ions and electrons. This common and coaxial portion is referenced 5 in FIG. 1 and extends as far as the sample which has an effect on the optical properties thereof.

In order to clarify the description, assume that the primary ions are positive (and preferably $Cs^+$ or $K^+$). In theory, the secondary ions are negative. The impact of the primary ions also creates secondary electrons. Finally, a primary electron beam (an electron microprobe), striking the same region of the sample as the primary ion beam (ion microprobe) also generates secondary electrons thereon. Under such conditions (see FIG. 1):

The primary ions emitted by the source of ions S10 are conveyed to the sample by primary electrostatic optical means given an overall reference 1 and including the common optical portion 5;

The secondary ions ejected from the sample EC are conveyed to the mass spectrometer SP20 by second electrostatic optical means 2, including the common optical portion 5;

Primary electrons are produced by an electron gun S30, followed by an electron beam adjusting optical system R31 for adjusting the geometry of the electron beam, and in particular for adjusting its diameter, said primary electrons are then conveyed towards the sample through the common optical portion 5;

Finally, the secondary electrons emitted from the sample EC pass also through the common optical portion 5 and are retrieved by a detector member D40 on leaving said common portion.

It is immediately apparent that the functions required of the common optical portion 5 are complex since it must:

Provide optical functions for four beams (primary/secondary, ion/electron) and this must be done in a manner which is compatible with all four beams, and in addition the beams must be independently adjustable;

These functions must continue to work properly even though the beams of ions and of electrons are made to scan and are subjected to synchronous corrections; and The above must be achieved while meeting the aim of having a small (i.e. fine) probe at the same time as highly efficient collection of secondary ions.

In order to do this, the input point (the top point, supposing the column to be vertical) to the common optical portion 5 is a pivot center for the primary ion scan (B13). In contrast, the primary electron scan takes place in a member B56 which is incorporated in the common optical portion.

Preferably, the instrument is folded. To this end, the primary ions are deflected through slightly less than 180° by a deflector D12 prior to arriving at their scanning member B13. The deflection is brought up to 180° by electrostatic plates B543 (see FIG. 3) which constitute a part of a beam combiner/separator member CS54, which constitutes the top end of the common optical portion 5.

Reciprocally, on leaving the member CS54, the secondary ions enter a device B23 for synchronous dynamic correction of the primary scan effect, followed by a deflector D22 which brings the deflection of the secondary ions to 180° and which performs energy filtering (at Fe22, see FIG. 3).

On the primary side, the first electrostatic optical means begin with an optical system R11 located between the source S10 and the deflector D12 for adjusting the primary ion beam.

On the secondary side, the second electrostatic optical means end with an optical system O21 for transferring the secondary ions from the outlet from the deflector D22 to the inlet to the mass spectrometer SP20.

DESCRIPTION OF A PARTICULAR EMBODIMENT

(USING POSITIVE PRIMARY IONS)

The ion microprobe (optical means 1)

The source of ions S10 is a source of cesium Cs+ of the kind described in U.S. Pat. Ser. No. 730,172 filed on May 3, 1985, using the version which is rich in axial ions having a nominal energy of 10 keV.

The adjusting optical system R11 begins with three electrostatic lenses L110, L111, and L112 disposed in cascade and positively polarized. These lenses are centered on the axis of the source and they form reduced images I1-P and I2-P (see FIG. 4A). The lenses are followed by centering plates B0113, and an astigmatism corrector CA114 which is adjusted to be effective right up to the sample.

Figure 4:
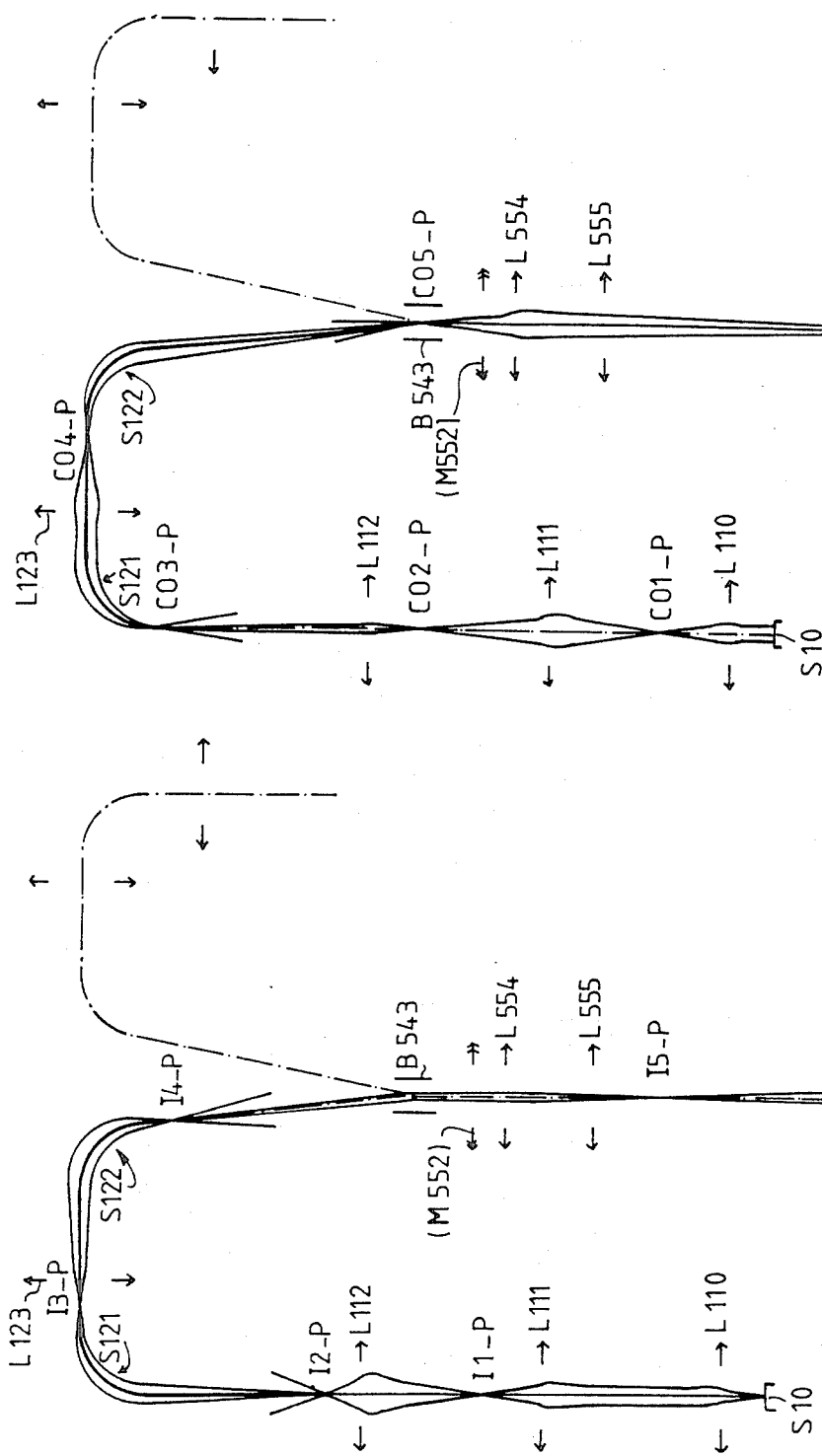
FIGS. 4A and 4B are similar detailed optical diagrams which additionally include representations of the image points and the aperture diaphragm points relating to positive primary ions.

The primary ion beam then enters the first electrostatic spherical sector S121 of the deflector D12. After being deflected through 90°, the image of the source is located at I3-P (FIG. 4A). An electrostatic lens L123 then conveys the ion beam to a second electrostatic spherical sector S122 which deflects it through 84°. On leaving the second deflector sector, which gives an image I4-P, the beam is directed towards the pivot center of plates B543, which bring the beams into the optical axis of the common optical portion 5 by further deflection through 6°.

The function of the lens L123 is to combine the achromatic focal lengths f S121, S122 and B543 so that the overall deflection of 180° produced by said optical systems is first order insensitive to possible variations in the ion accelerating voltage at the source, in the initial energy dispersion of the ions, and/or in the voltages applied to the electrostatic sectors (which are preferably the same for both sectors). It is also possible to perform energy filtering on the primary beam by means of a filter slot, not shown.

Figure 5:
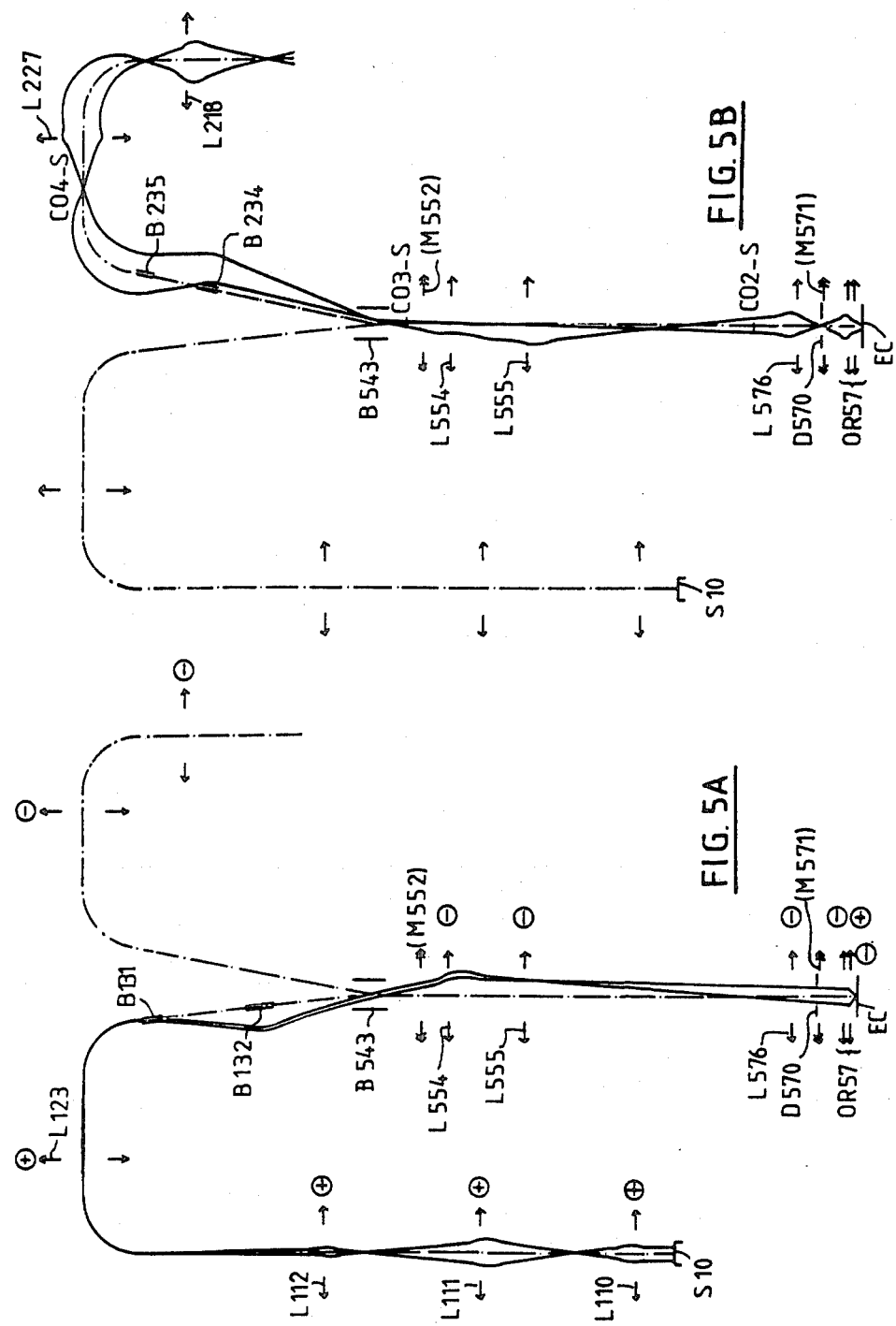
FIGS. 5A and 5B are further detailed diagrams showing how the primary ions and the secondary ions are scanned.

Between S122 and B543, but off the axis of the common optical portion, the primary ions are made to scan at B13 by two pairs of plates B131 and B132 disposed in cascade, said pairs of plates causing the beam to pivot in practice about the pivot center of B543 (see FIG. 5A). The resulting scan over the sample extends over about 10 micrometers.

Going along the common optical portion 5, and beyond the plates B543, the primary ions encounter: the electrostatic lens L554 which is positively polarized and which constitutes a portion of the shaping optical system MF55; and the near optical system OR57 which constitutes a part of the focussing/collecting terminal assembly FC57. The other components of the common optical portion have little or no effect on the beam of primary ions.

The lens L554 gives a penultimate image I5-P from the image I4-P. The near optical system OR57 makes the final reduced image on the surface of the sample. FIG. 4A shows the images. FIG. 4B should be read in conjunction with FIG. 4A and shows the corresponding crossover points CO1-P to CO6-P (i.e. the points where aperture diaphragms could be installed). The crossover points are where the trajectories of the ions which were initially parallel to the optical axis subsequently pass through said optical axis. These crossover points and the trajectories interconnecting them are important in obtaining a satisfactory optical system.

Near optical system OR57

Figure 6:
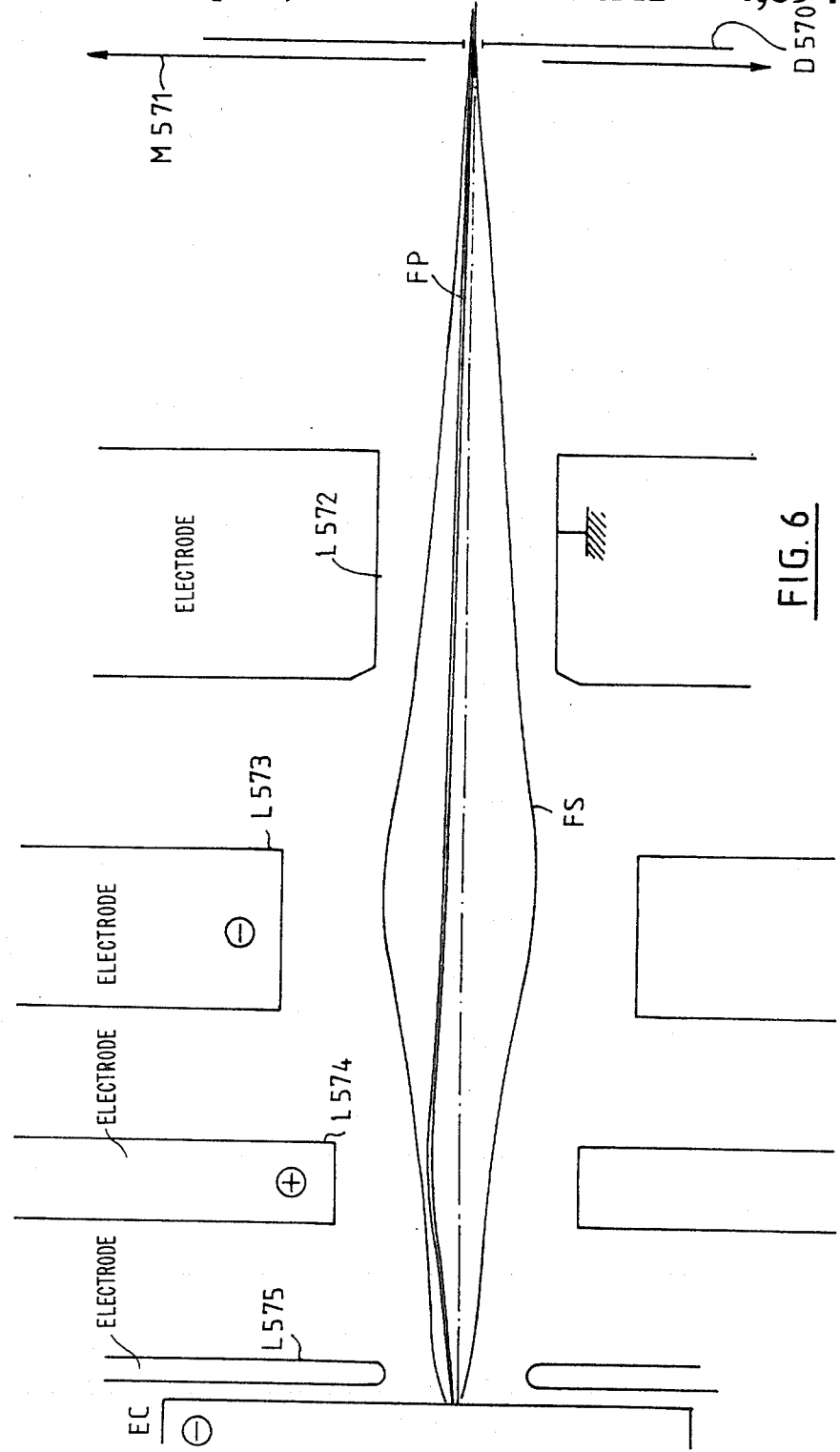
FIG. 6 is a detailed diagram of a near optical system included in the instrument.

FIG. 6 shows the near optical system OR57 in greater detail. It comprises a diaphragm D570 and electrodes L572 to L575, which electrodes are connected to various polarities.

The electrode L572 is grounded. The electrodes L573 and L575 are polarized with the same sign as the sample, i.e. the opposite sign to the primary ions. Only the electrode L574 is polarized with the same sign as the primary ions.

Thus, supposing the primary ions to be positive, the sample EC, the electrode L575 and the electrode L573 are all negatively polarized while the electrode L574 is positively polarized.

The electrode L554 forms an image of the pivot center (in B543) at the center of the diaphragm D570 which diaphragm acts as an aperture diaphragm for the beam of primary ions FP.

The disposition used for scanning the beam of primary ions ensures that scanning takes place about said pivot center without acting on the beam of primary electrons, nor on the secondary beams. However, the scanning takes place at a point where the image of the source is not small enough so that subsequent reduction in image size also has the effect of reducing the amplitude of the displacement of the ion microprobe over the sample ($\pm 10$ $\mu$m).

Finally, focus on the sample is adjusted by means of the positive lens L574 of the near optical system OR57. This focussing may be dynamically corrected by modulating the polarization of L574 synchronously with the scan, in such a manner as to ensure that the image of the ion source is continuously in focus on the surface of the sample regardless of the position of the microprobe.

Finally, it should be observed that the distance between the front of the near optical system and the sample is very small. The compact construction at the end of the optical system OR57 ensures that the last lens for reducing the ion microprobe has fairly low aberration coefficiets: both the chromatic aberration coefficient Cc and the spherical (or aperture) aberration coefficient Cs are about 20 millimeters.

As a result, the acceleration voltages and the energy V1 of the primary ions may be limited, making it possible to work with a medium brightness source without having an unacceptable effect on the intensity conveyed by the ion microprobe. Starting from a value of V1=10 keV, the near optical system OR57 raises the pimary ions to an impact energy of 15 keV.

These questions are dealt with in greater detail below after the aberrations have been described in greater detail.

It may be observed that the optical system OR57 includes a circular electrode L575 which is very close to the sample EC and at the same potential as the sample. This electrode is analagous to the control grid of an electron gun. The portion of the sample EC which is hidden by this electrode has no effect on the electric fields set up by the electrode L574 (whose potential is of opposite polarity), thereby allowing the sample to be moved without disturbing the processing of the primary or secondary ions.

Extracting secondary ions

A consequence of the above description is that the energy V2 of the secondary (negative) ions after acceleration will be not more than 5 keV, by virtue of the potential difference between the electrode L572 and the sample.

The position of the electrode L574 close to the sample and its opposite polarity relative thereto has the advantage of setting up a high ion extractor field close to the surface of the sample. This field is slightly attenuated by the presence of the electrode L575, but the electrode L575 provides an equipotential curving effect which helps focussing the secondary ions.

The secondary ions are focussed by the electrode L573, taking account of the effect of the other lenses and in such a manner as to ensure that the trajectories of secondary ions emitted over a solid angle of $2\pi$ steradians from a point on the surface of the sample EC come together in the plane of the diaphragm D570 (ignoring aberrations).

The secondary ion image I1-S (FIGS. 7A and 7B) formed in this way in the plane of diaphragm D570 is at about unity enlargement. The secondary ions can thus pass through this diaphragm without being attenuated regardless of the point of emission on the scanned area of the sample, so long as the scanned point is not too far from the axis.

It has been observed that the intensity in a given microprobe depends on the diameter of B570. Further, the number of pixels (i.e. elementary image points) which can be acquired in given time (and with acceptable statistical fluctuations) depends on the intensity of the microprobe.

The number of pixels thus depends on the diameter of the diaphragm D570. However, the number of pixels is also related, for a given size of microprobe, to the area of the field scanned on the sample. This area is limited by the diameter of the diaphragm D570. It should also be observed that the image of an emitting point is full of aberrations and that it is located in the plane of said diaphragm.

The microprobe can thus be scanned only insofar as the aberrations do not fill the entire open area of the diaphragm B570, otherwise vignetting is produced in the secondary electron and ion images created by the ion bombardment. (Vignetting is a reduction in the intensity of illumination near the edges of an optical instrument's field of view caused by rays being obstructed by the edge of an aperture).

Secondary particles whose initial energy (on being ejected) does not exceed about 20 electron volts have aberrations which are much smaller than the diameter of the diaphragm D570, even when the smallest diaphragm diameters are used in order to produce finer microprobes (since in that case the scanned field is also smaller).

For initial energies of more than 20 eV, account must be taken of the energy passband (i.e. the chromatic passband) of the mass spectrometer, and also of the various attenuations which are related to the limited acceptance of the mass spectrometer.

The person skilled in the art will understand that the near optical system OR57 which solves the above-described problems is an essential element of the invention.

Ion microprobe and optical aberrations

Figure 8:
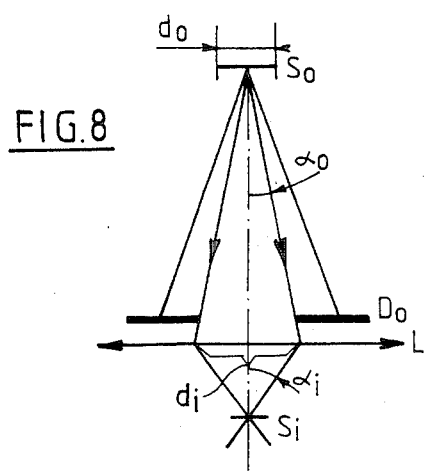
FIGS. 8, 8A, 8B, and 8C are simplified diagrams for explaining the operation of the ionic portion of an instrument in accordance with the invention.
Figure 8A:
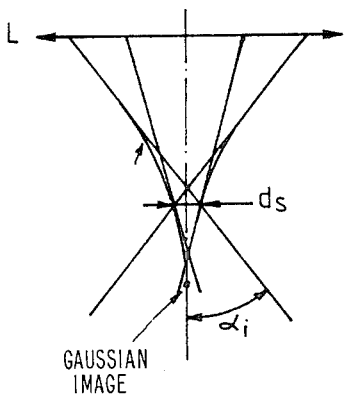
Figure 8B:
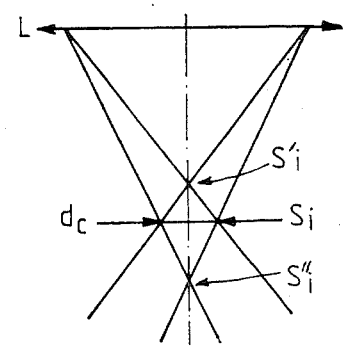

FIGS. 8, 8A and 8B are diagrams showing the first electrostatic optical means 1, in which said means are represented by a single electrostatic lens L accompanied by a diaphragm $D_o$.

The output from the source of ions is a restricted gap $S_o$ of diameter $D_o$. The kinetic energy of the primary ions is V, and the (chromatic) dispersion is $\pm \delta V$. An approximation to the average brightness B of a thermal source using surface ionization can be written:

$$(J_o/\pi)(V/\Delta V)$$

Where $J_o$ is the current emitted per unit area of the ionizer and $\Delta V = 2.\delta V$.

The diaphragm $D_o$ delimits an "object" aperture half angle $\alpha_o$, and $\alpha_i$ and $d_i$ respectively denote the aperture half angle and the Gaussian diameter of the microprobe on the "image" side of the lens L.

If $V_o$ and $V_i$ designate the energy of the ions in the object and the image spaces, respectively, considerations of optical symmetry give:

$$\sqrt{V_o} \cdot d_o \cdot \alpha_o = \sqrt{V_i} \cdot d_i \cdot \alpha_i$$

The angular enlargement $MA = \alpha_i/\alpha_o$, and the linear enlargement (which in fact is a reduction) is $ML = d_i/d_o$. When $V_i = V_o$, $MA.ML = 1$.

Aperture aberration

Aperture aberration is principally spherical aberration (FIG. 8A) characterized by a diameter $d_s$ of the intersection of a caustic type curve with the beam aperture limits ($\pm \alpha_i$) Thus: $d_s = \frac{1}{2} ML.Cs.\alpha_o^3$ Where Cs is the spherical aberration coefficient which may be written:

$$Cs = Cs_0 + Cs_1.$$
$$1/ML + Cs_2.(1/ML)^2 + Cs_3.(1/ML)^3 + Cs_4.(1/ML)^3$$

The coefficients $Cs_j$ (j=0 to 4) depend only on the geometrical and electrical characteristics of the lens L. As a function of j, and for $V_i = V_o$, it follows that when $ML << 1$, then:

$$d_s = \frac{1}{2}(ML^4.Cs)\alpha_i^3 \approx \frac{1}{2}(CS_4.\alpha_i^3)$$

This relationship is used to determine the aperture aberration of the lenses of the primary ion optics 1 (so long as the condition $V_i = V_o$ is satisfied). For the lens L574 in the near optical system OR57, $V_o$ (10 keV) is less than $V_i$ (15 keV). In this case the applicable coefficient is $Cs_4(V_i/V_o)^{3/2}$ which is applicable rather than $Cs_4$ on its own.

Chromatic aberration

FIG. 8B shows "chromatic" aberration. $S_i', S_i, S_i''$ are the images of $S_o$ for energies $V - \delta V$, $\delta V$, and $V + \delta V$, respectively. The diameter of the chromatic aberration spot (at $S_i$) is given by:

$$d_c = Cc.\alpha_i.\Delta V/V$$

where $\Delta V = 2.\delta V$

A "real" diameter d is then associated with the microprobe where:

$$d^2 = d_g^2 + d_s^2 + d_c^2$$

Where $d_g$ is the Gaussian diameter in the absence of aberration. For a given diameter d it has been observed that there exists a pair of values $(d_g, \alpha_i)$ for which the intensity of the probe passes through a maximum, which it is desirable to achieve. The smaller the aberration coefficients $Cs_4$ and Cc, in particular by virtue of using short focal length lenses, the greater the maximum.

With reference to the near optical system OR57, it may be observed that:

The front distance between the sample EC and the electrode L574 is small, and aberrations in the primary beam are therefore likewise small, allowing the intensity of the probe to be increased;

The electric field accelerates or slows down the primary beam depending on the point under consideration, but does not deflect the primary beam thereby eliminating risks of instability in probe position;

The behavior would be different if the primary beam were at an angle to the object, and in addition, there would be a shadow effect.

Dynamic focussing correction

Figure 8C:
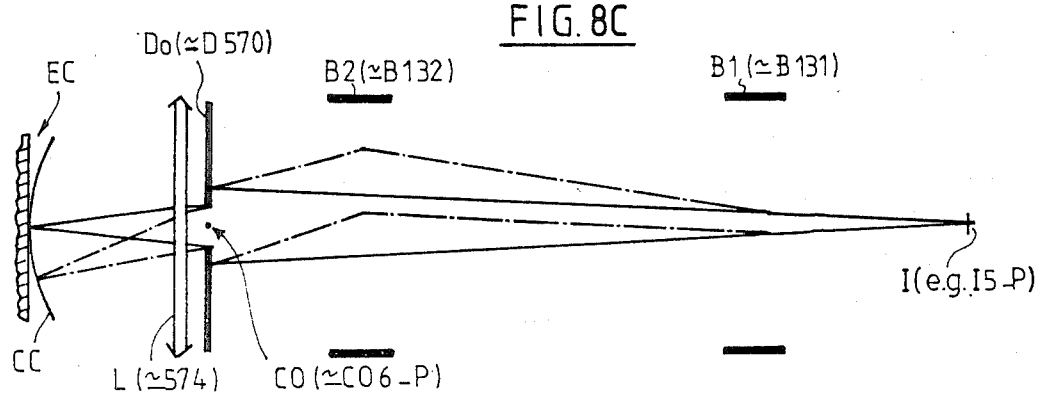

FIG. 8C is simplified in a similar manner to FIGS. 8 to 8B and shows how dynamic correction is performed by the lens close to the sample. It is recalled that an image of the pivot center of the primary beam is set up at the diaphragm D570 ($D_o$ in the FIG. 8C diagram).

Because of the scanning (see FIG. 8C) and because of aberration in the lens' field curvature, the probe would normally scan a portion of a sphere rather than a plane surface, which portion is shown as being tangential to the sample EC in the figure.

The polarization of the control electrode of the lens L in FIG. 8C (lens L574 in FIG. 6) is adjusted as a function of the scan position so that the probe is always focussed on the plane surface of the sample EC regardless of the scan position.

Secondary ion optics (optical means 2)

On leaving the surface of the sample EC, the secondary ions have energies lying in the range zero to about a hundred electron volts, and the distribution of energies has a maximum round about 5 to 10 eV. The ions are ejected in directions distributed over a solid angle of $2\pi$ steradians in an approximately cosine distribution centered on the axis.

In the optical system OR57, the electrode L574 may be at about +15 kV relative to the sample EC, for example.

The resulting accelerating electric field on the negative secondary ions opposes the natural divergence of the initial trajectories of these ions, and reduces the initial energy dispersion, in relative terms. This electric field imparts a kinetic energy to said ions (5 keV for single charge ions leaving L572) which is much greater than their initial average energy. In this respect, the sample EC is an integral part of the near optical system 57. For the purposes of simplification, the emissive surface of the sample EC is assumed to be conductive, plane, and at a uniform potential.

Figure 9:
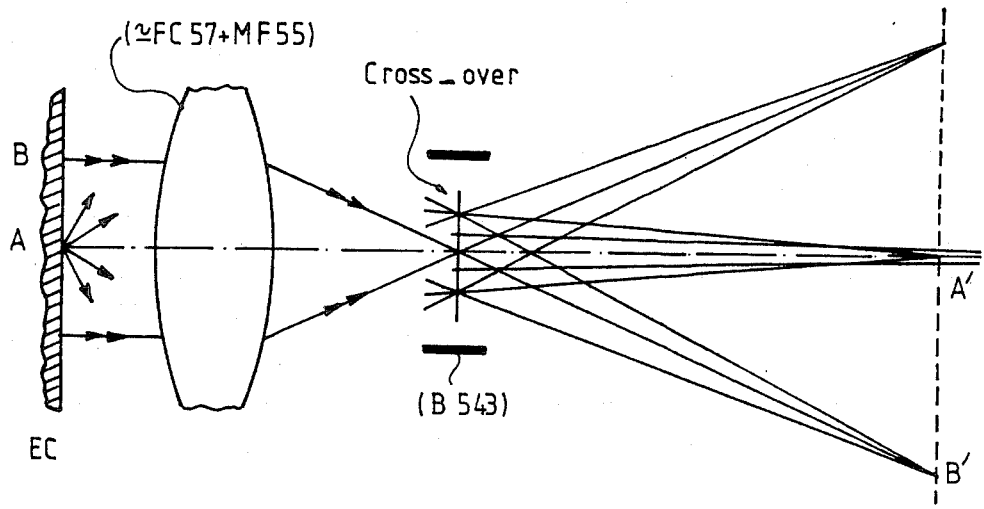
FIGS. 9 and 9A are simplified optical diagrams relating to the near optical system associated with the shaping optical system.

FIG. 9 is a simplified diagram in which the collection optics FC57 and the shaping optics MF55 are lumped together as a single lens 57 and the device B543 is represented by two scanning plates. Two particular optical items are associated with this collection optical system, namely the "cross-over" and the image which it creates.

Regardless of which point is emitting, trajectories which are normal to the surface of the sample pass through the optical axis at the same point. This is the cross-over point and it is advantageous to make this point coincide with the pivot center for dynamically correcting secondary ions (plates B234 and B235). However, the image is a little further away (see FIG. 9, and also CO3-S and I3-S in FIGS. 7A and 7B).

When collecting a scanning ion microprobe, merely recovering the secondary ions suffices in this case. The cross-over does not need to be limited in diameter in order to obtain fine localization of the emitting point (as is required for an ion microscope). The image of an object point (A or B) is so distorted by aberrations that the term "image" is hardly descriptive of the structure of the beam.

Figure 9A:
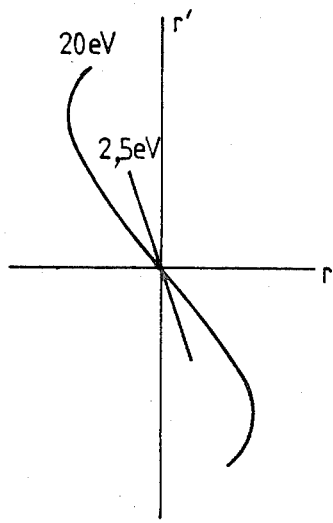

For example, if the meridian trajectories from an object point are limited, the distance r and the slope r' of the trajectories relative to a given point on the optical axis (see FIG. 9A) may be plotted along the X-axis and the Y-axis respectively.

If the optics were perfect, a straight line would be obtained passing through the origin. On FIG. 9A, this is true for 2.5 eV. However, as soon as the initial energy rises, the errors produced by aperture aberrations increase within increasing energy (see the 20 eV curve in FIG. 9A), i.e. the ions have trajectories which are further and further from the axis.

Meanwhile, chromatic defects in the collection optics give rise to different slopes at the origin for each energy.

The person skilled in the art will understand that although the first secondary ion image (I1-S, FIG. 7A) is incapable of spatially localizing the emission point, this point is nevertheless localized by the primary bombardment of the sample.

Figure 7:
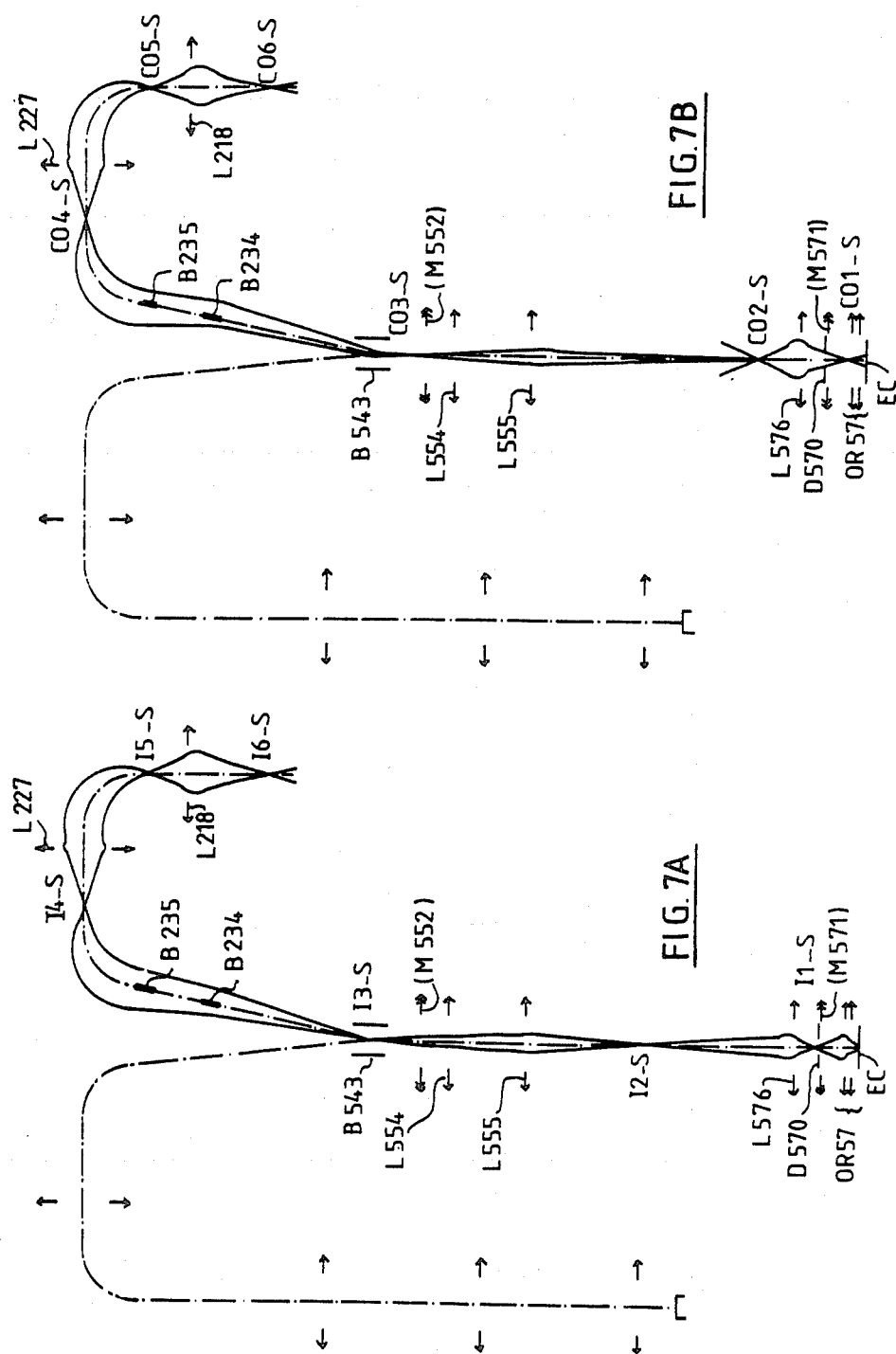
FIGS. 7A and 7B are detailed optical diagrams of the instrument respectively showing the images and the aperture diphragms of the negative secondary ions.

In the common optical portion 5, the lenses L556 and L555 (see FIG. 3) form intermediate images I2-S and I3-S (see FIG. 7A). These lenses are used, in particular, to ensure that the beam of secondary ions does not move too far away from the optical axis before reaching the plates B543, in particular when the emitting point is situated far from the axis, as can occur when scanning a sample over a wide field.

In the shaping optical system MF55, the positively polarized lens L554 provides only little convergence.

Tests have shown the following:

The beam of secondary ions from the impact area, after being shaped, must have a structure which is compatible with the acceptance of the mass spectrometer SP20, whose separating power is high;

However, a wide range of initial energies must be accommodated, furthermore, trajectories from the impact area are spread over an extended "cross-over" and over an image which is spoiled by rather large aberrations, the beam coming from a single point thus covers the entire geometrical extent which can be accepted by the spectrometer; and Consequently the beam coming from an adjacent point during scanning will not completely enter the spectrometer.

In order to solve this problem, the secondary ion beam is, in accordance with the invention, scanned synchronously with the primary beam, and this scanning operation is referred to as synchronous dynamic correction.

Figure 10:
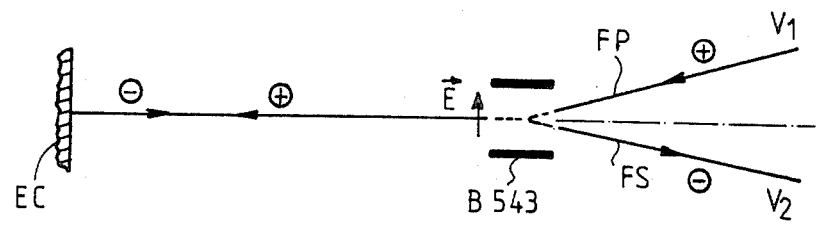
FIG. 10 shows how primary ions and secondary ions are separated.

FIG. 10 shows how the primary and secondary ion beams FP and FS are separated at the plates B543.

Figure 11:
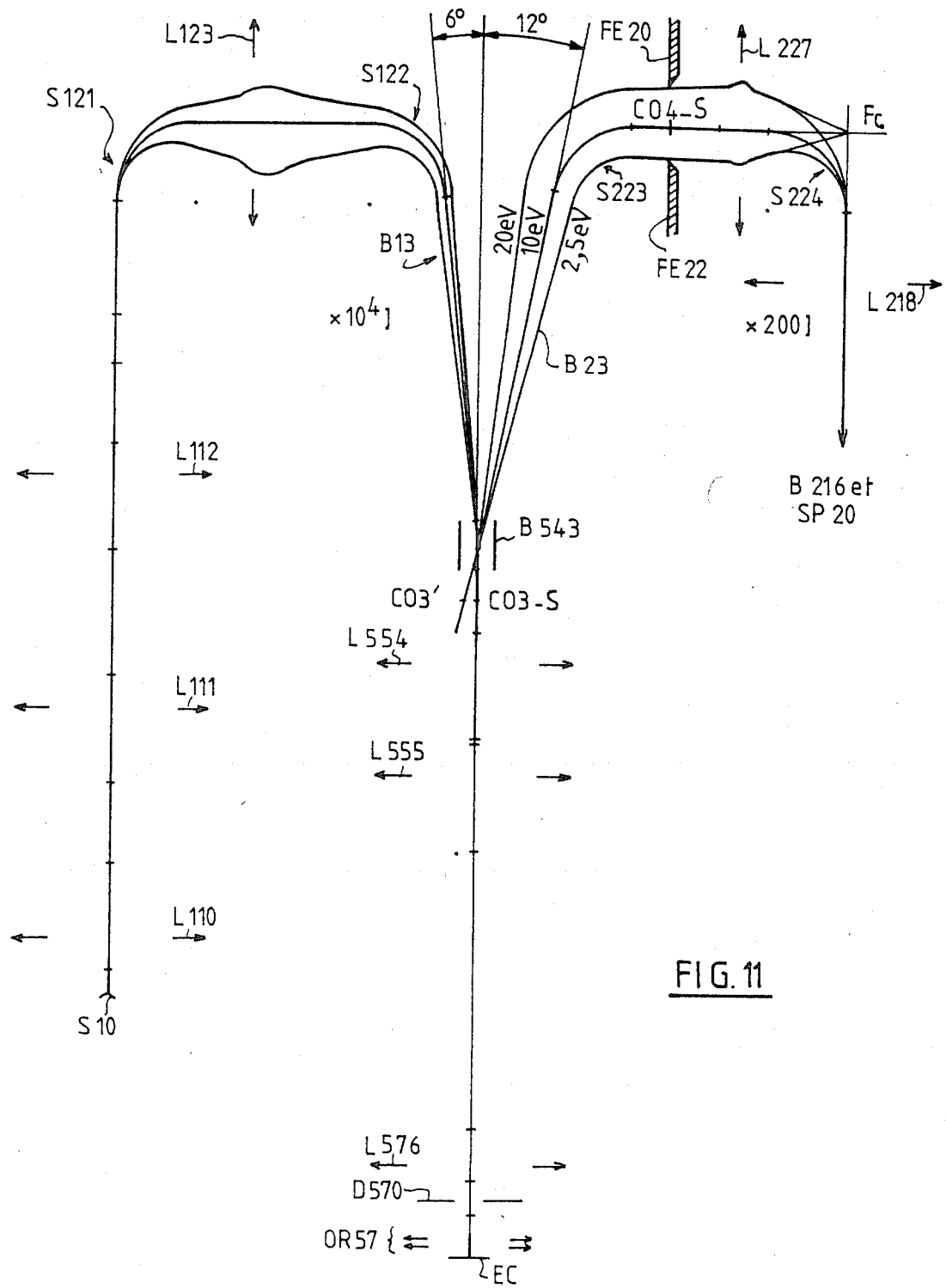
FIG. 11 shows the achromatic operation of the primary and secondary ion beam deflectors, taking account of the beam separator.

FIG. 11 shows the same phenomenon in greater detail. Since the primary ions have an energy $V1=10$ keV at this point whereas the secondary ions have an energy $V2=5$ keV, the primary ions are deflected through 6° whereas the secondary ions are deflected through 12°.

In the example described, the primary ions are $Cs^+$ or $K^+$, and the secondary ions are negative since implanting cesium or potassium gives rise to the emission of negative ions. Conversely, primary $I^-$ ions would have the same effect for positive secondary ions. The separator works in both cases and it even works when the energies of the primary ions and the secondary ions are interchanged (V1=5 keV; V2=10 keV).

It should also be observed that the plates B543 can be used to separate ions having the same sign, in which case they would be deflected in the same direction.

Downstream from the plates B543, the secondary ion beam heads towards the deflector D22 which is similar to the deflector D12 (see FIGS. 1 to 3).

However, the first electrostatic spherical sector S223 of the deflector D22 operates through 78° only (compare FIGS. 3 and 11). The sector S223 is coupled by the lens L227 to the second sector S224 which operates through 90°.

At this point, it is necessary to solve a problem related to the wide energy range of secondary ions: any electrostatic dispersion gives rise to energy dispersion, since the deflection angle depends on the energy of the particles.

Figure 12:
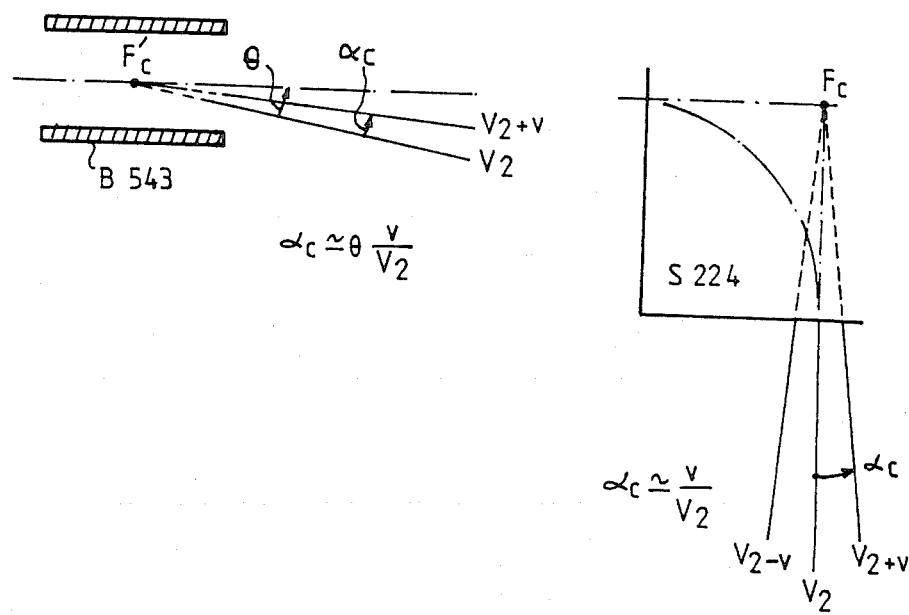
FIG. 12 shows the effects of chromatic dispersion due to ion deflection.

FIG. 12 shows two trajectories which differ by an angle $\alpha_c$, due to the fact that the trajectories correspond to energies V2 and V2+v. The trajectory "V2" is inclined at $\theta$ to the axis from the pivot center $F_c{}'$. When the angle 8 is small:

$$\alpha_c \approx \theta(v/V2)$$

For the spherical sector S224 which provides a deflection through 90°, $$\alpha_c \approx v/V2.$$

Conversely, if an energy dispersed beam having appropriate angles $\alpha_c$ is caused to converge towards $F_c$ (see FIG. 11), the axis of the beam will leave following a single radius. Chromatic dispersion is cancelled.

Thus, in accordance with the invention, the lens L227 is placed in such a manner as to conjugate the achromatic focal length resulting from the combined actions of B543, S223, and of the sector S224, by applying angular magnification suitable for cancelling the chromatic effects at the output from S224, at least to the first order.

When the probe scans the surface of a sample, the axis of the secondary beam pivots about its cross-over CO1-S (see FIG. 7B). The same is true for the images of the cross-over, namely CO2-S, and CO3-S (see FIGS. 5B, 7B, and 11).

Synchronous dynamic correction on the secondary beam is performed by two pairs of plates B234 and B235 (see FIG. 3). These two plates are disposed in such a manner that the pivot center resulting from their combined influence is located at (CO3)', which is the image of CO3-S as given by the plates B543. (see FIG. 11).

Then, by applying voltages to the plates B234 and B235, synchronously with the voltages applied to the plates B131 and B132 acting on the primary beam, rotation about (CO3)' can be cancelled.

The secondary beam is thus stationary on entering the deflector D22. As a result, the mass spectrometer SP20 always receives a secondary beam having the same geometrical characteristics regardless of the scan point from which it originates.

Meanwhile, an energy filtering slot FE22 placed at the cross-over CO4-S (FIG. 11) limits the band of energies transmitted to the spectrometer to the range 0 eV to 20 eV.

The transfer optics 021 and the spectrometer SP20 are preferably as decsribed in French patent application Ser. No. 84 01 332, with corresponding items being shown in the following table:

| The present application | US SN 695 240 |
|---|---|
| Lens L218 | Lens LE11 |
| Plates B216 | Plates PC12 |
| Slotted lens LF211 | Slotted lens LF13 |
| Lens L219 | Lens LE14 |
| Slot Fe21 | Slot FE20 |
| Post-acceleration PA21 (not shown) | Post-acceleration PA21 Hexapole HP22 |
| Spectrometer SP20 | References 23 to 25 (together with optical preceding letters) |

In outline, the lenses L218 and L219 co-operate to produce a beam restriction at the slot Fe21, which is the inlet slot to the spectrometer. The plates B216 center the beam. The slotted lens LF211 makes the beam parallel, and ensures a vertical section at the inlet slot F21. In some applications, a post-acceleration stage may be provided.

ELECTRON OBSERVATION MEANS

The electron beams are now described. These beams enable the samples to be observed by means other than the ion microprobe, and the resulting observations are complementary to the ion observations in several ways.

In the embodiment described so far, the scanning electron microscope operates by means of re-emission of secondary electrons.

The electron microprobe

The beam of primary electrons, at an energy of 30 keV for example, is conveyed by the magnetic lens M31 to the axis of the plates B543 of the combiner/separator CS54. A magnetic field perpendicular to the plane of the figure (see FIGS. 13, 13A, and 13B) is superposed on the electric field due to the plates.

The magnetic field is adjusted, taking account of the energy of the primary electrons, in order to exactly compensate the deflection which the electric field would produce on the electrons if it were acting alone. The primary electrons therefore continue along a rectilinear path.

It should immediately be observed that in the reverse direction, the secondary electrons at a different energy level are, in contrast, deflected towards a detector device D40 which includes an electrostatic sector S405 followed by a detector D406 (see FIG. 13B), for example an electron multiplier of the X919AL type as sold by R. T. C. A more elaborate version consists in post-accelerating the secondary electrons and in using a scintillator as the detector. An additional stage may be passed by modifying the structure of the electron beam to give access to a real cross-over image. Means may then be provided, if so desired, to make use of a portion only of the cross-over (or indeed of two or more different portions thereof in parallel in two or more distinct detection paths) in order to modify the contrast of the electron image or to show up different contrasts. This is because a cross-over contains all the information on the initial angular distribution of the electrons. Extracting just a portion of the cross-over thus has the effect of giving more weight to a solid angle of emission which is more or less populated, depending on the relief of the sample surface, for example, or on small local non-uniformities in the electric or the magnetic fields due to some feature of the very structure of the sample: contrast varies with the region of the cross-over taken into account. Thus, by taking electrons from two distinct regions of the cross-over in parallel makes it possible to perform image processing in order to better distinguish the sources of contrast.

The magnetic lens M552 serves to transfer the primary electron beam (taking due account of the presence of the electrostatic lenses) to a final reducing magnetic lens M571. In the main object plane of said lens, the diaphragm D570 limits the aperture of the primary electron beam. A conductive non-magnetic diaphragm may be immersed in the magnetic field of the lens to limit the aperture without disturbing processing. (This is not true of electrostatic lenses).

Between M552 and M571, a system B56 of coils essentially comprising four coils B56a and four coils B56b, disposed in pairs in two orthogonal planes serves to center and scan the electron probe, while astigmatism is corrected by eight coils (not shown) disposed halfway between the coils B56a and B56b. The magnetic field due to these coils has practically no influence on the trajectories of the primary and secondary ions.

It is thus possible to analyze a single sample both with an ion microprobe and with an electron microscope having comparable resolution,, which resolution may be as small as about ten nanometers.

Collecting secondary electrons

When the sample is negatively polarized (for use with positive primary ions) the primary electron beam gives rise to a beam of re-emitted secondary electrons.

The near optical system OR57 thus need to extract the secondary electrons in order to accelerate them in substantially the same way as it accelerates the negative secondary ions (to the same energy, but with less chromatic aberration). The first secondary ion image I1-S is formed close to the diaphragm D570 (see FIG. 7A).

However, the diaphragm is immersed in the magnetic field of the lens M571 and is located in the main object plane thereof (for the primary electrons). Further:

The lens M571 exerts a much greater focussing action on the secondary electrons (at 5 keV) than it does on the primary electrons (at 30 keV);

The leakage field from the magnetic lens M571 reaches as far as the sample EC, and also penetrates through the electrostatic lens L576 (see FIG. 3);

Finally, the magnetic optics rotates the electron images around the optical axis.

The ion image (I1-2, FIG. 7A) and the electron image (I'A, FIG. 13B) are thus not superposable, nor are they situated at exactly the same place.

It turns out that this problem can be solved in a satisfactory manner by acting on the polarization of the electrode L573 in order to bring the electron image I'1 into the plane of the diaphragm B570 without moving the ion image I1-S so far that it gives rise to a vignetting effect.

As a result, the ion image and the electron image are clearly separated (compare I2-S in FIG. 7A with I'2 in FIG. 13B).

The secondary electrons first encounter the scanning coils B56. They are deflected about 2.5 times as much by the scanning coils than are the primary electrons. A compromise may be obtained by setting up the distance relative to the sample so that the image has turned through 90° at the coils. The lenses L576 and L555 can then shape the beam of secondary electrons so that it passes through the lenses L554 and M552 without attenuation due to electrons being too far from the axis.

Thus, a secondary electron image I'3 is to be found at lens M552.

The secondary electrons are then separated from the primary electrons by the member CS54 and are finally detected, as described above, in order to create an electron image in synchronization with the electron scan (which image may be a video image).

Electron observation variants

It is clear that if the secondary electrons are due solely to ion bombardment (with no primary electrons being simultaneously provided by the electron gun), the lenses M571 and M552, and also the scan B556 may be inactivated. The plates B543 and the magnetic field then extend far enough to separate the secondary ions from the secondary electrons.

If the sample is thin, electron observation thereof may be performed by transmission electron microscopy. The energy of the primary electrons then needs to be raised, for example up to 100 keV. A detector similar to those already used in transmission electron microscopy (advantageously of a type suitable for analyzing the energy losses to which the electrons are subjected) is then located behind the sample EC within the sample carrier PO. The secondary ions due to the ion microprobe may also be observed, as described above, together with the secondary electrons which the sample may continue to emit under the effect of the primary electron bombardment.

General operation of the instrument

It is important to observe that the selection of acceleration energies for the various particles in combination with the sign difference between the primary and the secondary ions are used to make it possible to adjust each beam in a manner which is substantially independent from the adjustment of the other beams.

In particular, the magnetic lenses of the microscope which focus the primary electrons have very little effect on the ion beams.

The positively polarized electrostatic lenses act on the positive primary ions but their focussing effect on the negative secondary ions (or on the secondary electrons) is much smaller. Their focussing effect on the primary electrons is practically negligible.

The negatively polarized lenses act on the negative secondary ions and on the secondary electrons (which are accelerated to the same energy) but have relatively little effect on the positive primary ions and practically no effect on the primary electrons since their energy is too high (30 keV).

When using negative primary ions and collecting positive secondary ions, adjustments can still be made more or less independently. However, in this case it is not possible to simultaneously obtain an ion image and a secondary electron image since the secondary electrons are retained on the target by its positive polarization. When observing thick samples, there nevertheleness remains the possibility of using backscattered electrons, so long as their energy is high enough to escape the attraction of the sample.

When examining thin samples in transmission microscopy, it is always possible to simultaneously obtain electron images in conjunction with secondary ions which may be positive or negative.

Finally, charge effects which could appear on insulating samples when collecting negative secondary ions may be eliminated by using the primary electron beam in a special way. If the energy of the primary electrons is reduced to 5 keV, they are reflected with very low energy close to the surface of the sample. As a result positive charges which tend to develop on the insulator, in part because of secondary electron emission, are automatically cancelled without an excess of negative charge developing since the electron beam would then automatically be deflected elsewhere (French patent application No. 83 00 538).

Electronic auxiliary equipment for the instrument

Reference is now made to FIG. 2 while describing the instrument's auxiliary equipment, which equipment makes the above-described operation possible.

A block AS30 feeds the electron gun in known manner.

The scanning electron microscope lenses (M31, magnetic field at B543, M552, M571) are controlled from a feed block AM31.

A feed block AD supplies high tension to the achromatic deflectors D21 and D22, or more exactly to their spherical sectors.

A feed block ACS controls the feed and the adjustment of the beam separator CS54, and a block AMF controls said beam by means of the shaping optics MF55.

The diameter of the ion probe is adjusted by R11 under the control of a circuit AR11, and the ion source S10 is powered and adjusted by means of a circuit AS10.

A circuit AFC controls the focussing/collecting terminal assembly FC57.

A circuit CG monitors and controls the vacuum and the safety aspects related thereto.

A computer or a central processor unit UCT associated with a mass storage device MEV is provided to collect the measurements, and preferably to assist in the adjustments provided by the other circuits.

In any event, the computer controls the image scanning system SBI which acts directly on the ion scanning means B12 and B23, on the electron scanning means B56, and on the motion of the sample carrier PO. The system SBI acts indirectly on the lens L574 (FIG. 6) and on the optical system FC57 (FIG. 2) or more precisely on the near optical system OR57 (FIG. 6), in order to provide dynamic focussing. This action takes place via a circuit AFC for collecting secondary particles and for performing dynamic focussing, which circuit controls the optics FC57 (except for its magnetic lens).

A unit CSM under the control of the computer UCT exercises control on the mass spectrometer SP20.

The measurements from the spectrometer SP20 and from the electron detector D40 are acquired in an acquisition circuit MAD, which also has an effect on the scanning system SBI.

Finally, the computer UCT collects the measurements and stores them in the mass memory MEV as a function of the scan.

PRACTICAL IMPLEMENTATION OF THE INSTRUMENT

Some other aspects of the invention are now described using as a specific example an ion probe having a diameter of 0.1 μm and an intensity of $7.10^{-12}$A (on the sample).

The effect of emission noise

If an image point or pixel is the same size as the probe diameter, then a pixel receives an average of n=440 ions per $10^{-5}$ seconds.

Assuming that five atoms are extracted from the sample per incident ion, irradiation for $10^{-5}$ sec. will remove a layer of material having a thickness of about $5.10^{-2}$ Angstroms (this is the destructive effect of ion analysis).

About ten secondary electrons are generated per incident ion, so the electron signal from a pixel may be detected, but it is accompanied by statistical noise of about ±5%.

Under such conditions, obtaining a secondary electron image which is renewed at the television field rate (25 images per second) implies that the scanned field must be limited to $4.10^3$ pixels. In order to increase the field, the current intensity of the probe must be increased.

However, taking account of the fact that the minimum observable contrast C is equal to K times the noise:

$$C = (n2 - n1)/n > K\sqrt{n}$$

Where n2 and n1 are the numbers of incident ions on two adjacent areas and n is the average number of incident ions. Putting K=5, N=$4.10^3$ and n=440 ions, the image must have at least 25% contrast on emission. This holds for 25 frames per second, but operating at one frame per second makes it possible to observe contrasts of 5%.

Further, the image will change under the effect of ion erosion. It may be supposed that the topography of the sample will not change perceptively before the thickness of material removed therefrom is equal to about one third of the probe diameter (i.e. about 300 Ångströms). In the example given, this corresponds to about four minutes of observation, which is compatible with observation of the secondary electron image at a TV frequency. The use of potassium would reduce the erosion rate on the sample and increase the observation period.

However, other factors may have an influence on the quality of the electron image, in particular:

The implantation of primary ions (esium). enhances secondary electron emission, and this effect may vary from one crystal grain to the next, and it may also vary during transient secondary electron emission conditions as a function of primary ion bombardment; and This effect may also enhance fixing molecules of the residual gas in the evacuated enclosure, and thereby have an influence on the efficiency of secondary electron emissions.

The secondary ion image (as obtained by scanning the sample with the ion microprobe) is more difficult to obtain since each incident primary ion creates fewer secondary ions than it creates secondary electrons. Generally speaking, the useful yield of secondary ions (i.e. the ratio between the number of secondary ions which reach the detector (the spectrometer) divided by the number of atoms ejected from the sample) depends on the probability of ion formation during the ejection process and on the efficiency with which the extractor system couples to the mass spectrometer collects said ions.

Thus, with an average yield of one secondary ion per 50 ejected atoms, and an atom concentration of 25%, the image obtained in 1/25 of a second over $4.10^3$ points per image using a probe having a diameter of 0.1; microns is 10 ions per pixel on average. As a result the statistical noise is ±30%.

In order to reduce this noise, a greater thickness of material must be eroded during the image acquisition time, i.e. the probe must be of greater intensity.

Using a probe which is 40 times as intense (for the same pixel size) the statistical noise is the same as in the electron image at TV frequency, however the thickness eroded per image is 2 Ångströms.

In order to achieve the same statistical noise using the initial probe (0.1 microns, $7.10^{-12}$ Amps, and 0.05 Ångströms eroded per image) the number of pixels per image must be reduced to $10^2$ (at 25 images per second).

However, the invention offers another possibility:

The secondary electron image due to ion bombardment may be used to adjust ion probe focussing at a video frequency (25 images/second);

Once that has been done, there is no need to observe the secondary ion image at the video frequency.

The influence of detection noise

Account must also be taken of the background noise in the ion detector, which is the mass spectrometer in this case.

For an ion image having $4.10^3$ pixels of 0.1 micron diameter, data may be accumulated over a period corresponding to eroding a thickness of 300 Ångströms (in 4 minutes).

After four minutes, an element present at a concentration of 40 ppm will have produced about ten characteristic ions per pixel.

Putting the average background noise of the spectrometer at 0.1 strikes/second, the noise will be about 25 strikes over four minutes. The ratio of the secondary ion signal to the noise due to detection is greater than $10^3$, which is satisfactory.

The influence of the quality of the vacuum

Finally, there remains the effect of the residual gas in the evacuated enclosure. The presence of water vapor, carbon dioxide, and other residues may induce, even at a very low pressure, various types of ion to be emitted, and in particular $H^-$, $C^-$, $OH^-$, and $OH^-$.

For a vacuum at $5.10^{-9}$ Torr, each square micron of the sample surface receives $1.5 \times 10^4$ molecules per second.

If all these molecules fix to the surface, and if their ionization yield is the same as for atoms of the sample, the ratio between the number Nv of atoms due to the residual gas on the sample (e.g. oxygen) to the number NA of ejected atoms per unit time may be written:

$$Nv/NA = (1.5 \times 10^4)/\rho \cdot \epsilon \simeq 50 p/\epsilon$$

Where $\rho$ is the atomic density of the sample (number of atoms per micro-cube), is the eroded thickness in microns per second, and p is the partial pressure expressed in Torr.

In the present example ($p=5.10^{-9}$ Torr, probe diameter $=0.1$ microns over $4.10^3$ pixels), $\epsilon = 1.25 \times 10^{-4}$ microns per second, giving $Nv/NA \simeq 2.10^{-3}$.

The influence of the residual gas is thus equivalent to a concentration of matter in the sample of 0.2%, i.e. it is 50 times above the threshold of detection (40 ppm per pixel).

It is thus necessary to improve the vacuum, or to work with a higher intensity probe, and/or to scan a smaller area.

Let C be the minimum observable contrast, Np be the probe current in ions per second, N be the number of pixels per image, t be the exposure time for the electron image, t be the atomic density of the sample, S be the ion yield from the sample, and e be the eroded thickness.

It has been observed that:

$$C = K\sqrt{N} / \sqrt{Np \cdot t} \text{ where } K \text{ is a constant}$$

and $e = Np \cdot S \cdot t/\rho \cdot Nd^2$
whence $\rho \cdot d^2 \cdot e = S \cdot K^2/C^2$ This shows that the observable contrast is essentially limited:
by the thickness e which may be eroded without reducing resolution (as given by the diameter d); and
by the yield S.

This information can be related to that given above since:

$$\epsilon = e/t = Np.S/\rho.N.d^2$$

whence $Nv/NA = 50p(\rho Nd^2/Np.S)$

Putting $N=10^4$ and $p=5.10^{-9}$, the following table summarizes the results.

| Probe diameter d (microns) | Probe current Np (ions/second) | Nv/Na $(5.10^{-9}$ Torr; $10^4$ pixels) |
|---|---|---|
| 0.02 | $4.10^5$ | 0.5 |
| 0.05 | $4.10^6$ | 0.05 |
| 0.1 | $4.10^7$ | 0.005 |
| 0.5 | $3.10^9$ | $6.10^{-5}$ |

These values suppose that the beam scan rate is high enough to ensure that erosion takes place as though the bombardment was uniform in spite of it occurring in the form of a TV type frame scan.

Various means can be used to reduce these effects, in particular, the scanning may be digitally controlled, thereby enabling a higher degree of flexibility, or enabling the beginning of emission to be eliminated (and consequently avoiding the transient conditions associated therewith).

We claim:

1. An instrument for micro-analysis of a solid sample, comprising the following items enclosed in an evacuated chamber:
    a moving sample carrier means for receiving the sample to be analyzed;
    a source of primary ions;
    first electrostatic optical means for causing a beam of primary ions from said source to bombard the sample, and for causing beams of secondary electrons and of secondary ions to be emitted by the sample;
    an ion analyzer having inlets and including a mass spectrometer;
    second electrostatic optical means for collecting the beam of secondary ions emitted by the sample, and for conveying the beam of secondary ions collected in this manner to the inlets of said ion analyzer said first and said second electrostatic optical means including a common and coaxial optical portion having ends, a first pivot center, and having an axis perpendicular to the sample carrier means and extending to the vicinity thereof in order to perform highly efficient collection of the secondary ions while simultaneously processing the primary and secondary ion beams, and further including, at one of the ends of said common and coaxial optical portion furthest from the sample, primary ion beam scanning means for causing said beam of primary ions to scan about said first pivot center located in the axis of said common and coaxial portion, said primary ion beam scanning means being associated with synchronous dynamic correction means for providing synchronous dynamic correction of the beam of secondary ions about a second pivot center located at a cross-over image point provided by said second electrostatic optical means;

separator means for separating the beams of primary and secondary ions; and autonomous electron observing means for observing the sample and comprising:
  magnetic optical means incorporated coaxially with said common and coaxial optical portion, and for being adjustable in a manner which is substantially decoupled from said first and second electrostatic optical means; and
  means for applying a transverse magnetic field at the end of the common and coaxial optical portion furthest from the sample causing the beams of secondary electrons and secondary ions emitted from the sample to separate, and for enabling an ion image and an electron image of the sample to be obtained simultaneously.

2. An instrument according to claim 1, wherein said autonomous electron observing means comprises a scanning electron microscope having scanning means incorporated in said common and coaxial optical portion, for scanning the sample.

3. An instrument according to claim 1, wherein said common and coaxial optical portion comprises, in the immediate vicinity of said sample carrier, near optical means including a diaphragm, for focusing an image of said primary ion source, said primary ion source having an angular aperture determined by said diaphragm at which an image is formed of the primary beam scan of said first pivot center; wherein said focussing includes synchronous and dynamic correction in accordance with the primary beam scan and wherein said near optical means performs collection of secondary electrons and of secondary ions and forms an ion image and an electron image therewith in the vicinity of said diaphragm.

4. An instrument according to claim 3, wherein said near optical means comprises, in order from said diaphragm to said sample:
  said diaphragm;
  an annular electrode which is grounded;
  a collection controlling electrode connected to a voltage of the same polarity as the sample;
  a focussing electrode connected to a voltage of the opposite polarity as the sample; and
  delimiting electrode means placed in the vicinity of the sample for delimiting the surface which may disturb the electric focussing fields, delimiting electrode means being supplied with a voltage of the same polarity as the sample, which polarity is opposite to the polarity of the primary ions.

5. An instrument according to claim 3, wherein the energy of the beam of primary ions is raised by about 50% in the near optical means.

6. An instrument according to claim 5, wherein the energy of the beam of primary ions is about 10 keV upstream from the near optical means and is raised to about 15 keV by co-operation of said near optical means with the sample, wherein the energy of the secondary ions is substantially equal to the increase in energy applied to the primary ions by the near optical means.

7. An instrument according to claim 3, further including a magnetic lens in the vicinity of said diaphragm of the near optical means.

8. An instrument according to claim 3, wherein said near optical means comprises a portion of a shaping optical means for shaping the ion probe and for collecting secondary particles, said shaping optical means further including an electrostatic lens upstream from said diaphragm.

9. An instrument according to claim 3, wherein said common and coaxial portion comprises, upstream from said near optical means:
  a beam combiner/separator comprising a pair of electrostatic plates and defining said first pivot center;
  a shaping optical means for shaping the ion and the electron beams; and
  electron beam scanning means for scanning said electron beam.

10. An instrument according to claim 9, wherein:
  said shaping optical means comprises a magnetic lens followed by two electrostatic lenses which are polarized by opposite voltages; and
  said electron beam scanning means comprises two sets of two electromagnetic coils disposed one after the other.

11. An instrument according to claim 1, said instrument having first and second primary electrostatic sectors and first and second secondary electrostatic sectors, and wherein said primary ion beam scanning means comprises two pairs of plates placed after said first and second primary electrostatic sectors and two pairs of plates preceding said first and second secondary electrostatic sectors said primary ion beam scanning means for causing said secondary ion beam to be stationary at the output from said secondary electrostatic sectors regardless of the scan applied to the primary beam.

12. An instrument according to claim 11, wherein a first electrostatic coupling lens is provided between said primary electrostatic sectors, and an energy filtering slot followed by, a second electrostatic coupling lens is provided between said secondary electrostatic sectors.

13. An instrument according to claim 1, wherein said first electrostatic optical means includes, after said source of ions, diameter adjusting optical means for adjusting the diameter of said primary ion beam.

14. An instrument according to claim 3, wherein said first electrostatic optical means forms successively smaller images of the ion source, where the ion and electron images formed in the vicinity of said diaphragm are at substantially unity enlargement.

15. An instrument according to claim 1, wherein the ion analyzer comprises a transfer optical means followed by a high-aperture mass spectrometer, for multiple simultaneous detection of said secondary ions.

16. An instrument according to claim 1, further comprising an electron gun means for emitting an electron beam including primary electrons disposed coaxially with said common and coaxial optical portion and upstream therefrom, and a magnetic lens means, following said gun, for adjusting the diameter of the electron beam.

17. An instrument according to claim 16, wherein the energy of the primary electrons is about 16 keV.

18. An instrument according to claim 16, wherein the energy of the primary electrons is about 100 keV, and the sample is of sufficient thinners so as to enable the sample to be observed by transmission electron microscopy.

19. An instrument according to claim 11, further including, at the far end of said common and coaxial optical portion relative to said sample, a third secondary electrostatic sector for retrieving the secondary electrons and conveying them to a detector.

* * * * *

UNITED STATES PATENT AND TRADEMARK OFFICE
CERTIFICATE OF CORRECTION

PATENT NO. : 4,694,170

DATED : Sept. 15, 1987

INVENTOR(S) : Slodzian et al.

It is certified that error appears in the above-identified patent and that said Letters Patent is hereby corrected as shown below:

Col. 3, line 24, "diagraphm" should be --diaphragm--;
       line 28, "singal" should be --signal--;
       line 45, "diaphrgm" should be --diaphragm--.

Col. 6, line 8, ". Under" should be --, under--.

Col. 10, line 33, "L)$^3$" should be --L)$^4$--.

Col. 11, line 39, "kV" should be --keV--.

Col. 14, line 21, "F21" should be --Fe21--.

Col. 18, line 42, "(esium)." should be --(cesium)--;
       line 66, delete ";".

Col. 19, line 22, "4.103" should be --4.10$^3$--;
       line 68, "t" should be --$\rho$--.

Col. 21, line 59, "fieids" should be --fields--; before "delimiting" insert --said--.

UNITED STATES PATENT AND TRADEMARK OFFICE
CERTIFICATE OF CORRECTION

PATENT NO. : 4,694,170

DATED : September 15, 1987

INVENTOR(S) : Slodzian et al.

It is certified that error appears in the above-identified patent and that said Letters Patent is hereby corrected as shown below:

Col. 22, line 37, after "sectors" insert --,--;
      line 45, delete ",".

Col. 23, line 3, "thinners" should be --thinness--.

Signed and Sealed this

Nineteenth Day of April, 1988

Attest:

DONALD J. QUIGG

*Attesting Officer*      *Commissioner of Patents and Trademarks*

UNITED STATES PATENT AND TRADEMARK OFFICE
CERTIFICATE OF CORRECTION

PATENT NO. : 4,694,170

DATED : September 15, 1987

INVENTOR(S) : Slodzian et al.

It is certified that error appears in the above-identified patent and that said Letters Patent is hereby corrected as shown below:

Title page:

[73] "Assignees:", line 3, change "Parissud" to --Paris-Sud--.

Signed and Sealed this

Twelfth Day of July, 1988

Attest:

DONALD J. QUIGG

*Attesting Officer*  *Commissioner of Patents and Trademarks*